United States Patent
Chen et al.

(10) Patent No.: US 11,862,271 B2
(45) Date of Patent: Jan. 2, 2024

(54) MEMORY TESTING TECHNIQUES

(71) Applicant: Arm Limited, Cambridge (GB)

(72) Inventors: Andy Wangkun Chen, Austin, TX (US); Yannis Jallamion-Grive, Mouans Sartoux (FR); Cyrille Nicolas Dray, Antibes (FR)

(73) Assignee: Arm Limited, Cambridge (GB)

( * ) Notice: Subject to any disclaimer, the term of this patent is extended or adjusted under 35 U.S.C. 154(b) by 91 days.

(21) Appl. No.: 16/418,833

(22) Filed: May 21, 2019

(65) Prior Publication Data
US 2020/0194093 A1    Jun. 18, 2020

Related U.S. Application Data

(60) Provisional application No. 62/780,881, filed on Dec. 17, 2018.

(51) Int. Cl.
*G11C 29/00* (2006.01)
*G11C 29/42* (2006.01)
(Continued)

(52) U.S. Cl.
CPC ............ *G11C 29/42* (2013.01); *G06F 11/102* (2013.01); *G06F 11/106* (2013.01); *G06F 11/27* (2013.01);
(Continued)

(58) Field of Classification Search
CPC ......... G11C 29/42; G11C 29/44; G11C 29/34; G11C 29/802; G11C 29/781; G11C 29/025; G11C 2029/1802; G11C 29/814; G11C 29/74; G11C 2029/0403; G11C 29/72; G11C 2029/3602; G11C 29/36; G11C 29/24; G11C 29/16; G11C 29/52; G11C 29/4401; G11C 29/20; G11C 29/81; G11C 29/10; G11C 29/12; G06F 11/27;
(Continued)

(56) References Cited

U.S. PATENT DOCUMENTS

| 5,914,907 A | * | 6/1999 | Kobayashi | ............ | G11C 29/84 |
| | | | | | 365/201 |
| 5,943,693 A | * | 8/1999 | Barth | ..................... | G11C 29/76 |
| | | | | | 365/230.01 |

(Continued)

*Primary Examiner* — Albert Decady
*Assistant Examiner* — Osman M Alshack
(74) *Attorney, Agent, or Firm* — Pramudji Law Group PLLC; Ari Pramudji

(57) ABSTRACT

Various implementations described herein refer to a device having an encoder coupled to memory. The ECC encoder receives input data from memory built-in self-test circuitry, generates encoded data by encoding the input data and by adding check bits to the input data, and writes the encoded data to memory. The device may have an ECC decoder coupled to memory. The ECC decoder reads the encoded data from memory, generates corrected data by decoding the encoded data and by extracting the check bits from the encoded data, and provides the corrected data and double-bit error flag as output. The ECC decoder has error correction logic that performs error correction on the decoded data based on the check bits, wherein if the error correction logic detects a multi-bit error in the decoded data, the error correction logic corrects the multi-bit error in the decoded data to provide the corrected data.

19 Claims, 10 Drawing Sheets

(51) Int. Cl.
  *G06F 11/27* (2006.01)
  *G06F 11/10* (2006.01)
  *G11C 29/34* (2006.01)
  *G11C 29/02* (2006.01)
  *G11C 29/18* (2006.01)

(52) U.S. Cl.
  CPC ............ *G11C 29/025* (2013.01); *G11C 29/34* (2013.01); *G11C 29/781* (2013.01); *G11C 29/802* (2013.01); *G11C 2029/1802* (2013.01)

(58) Field of Classification Search
  CPC .. G06F 11/102; G06F 11/106; G06F 11/1608; G06F 11/167
  USPC .................................. 714/711, 718, 758, 763
  See application file for complete search history.

(56) References Cited

U.S. PATENT DOCUMENTS

| | | | | |
|---|---|---|---|---|
| 5,987,632 | A * | 11/1999 | Irrinki | G11C 29/72 714/6.32 |
| 6,584,589 | B1 * | 6/2003 | Perner | G11C 29/50 365/201 |
| 7,304,875 | B1 * | 12/2007 | Lien | G11C 15/00 365/49.1 |
| 2002/0026608 | A1 * | 2/2002 | Daehn | G11C 29/36 714/718 |
| 2002/0181303 | A1 * | 12/2002 | Kato | G11C 29/808 365/200 |
| 2003/0084386 | A1 * | 5/2003 | Barth, Jr. | G11C 29/72 714/718 |
| 2004/0085821 | A1 * | 5/2004 | Kim | G11C 29/76 365/200 |
| 2004/0153925 | A1 * | 8/2004 | Ronza | G11C 29/4401 714/724 |
| 2007/0136625 | A1 * | 6/2007 | Niijima | G11C 29/56 714/718 |
| 2008/0239809 | A1 * | 10/2008 | Chae | G11C 11/5621 365/185.09 |
| 2014/0146624 | A1 * | 5/2014 | Son | G06F 11/1048 365/200 |
| 2014/0210535 | A1 * | 7/2014 | Bartling | G11C 14/0072 327/199 |
| 2014/0317469 | A1 * | 10/2014 | Sohn | G11C 29/42 714/764 |
| 2015/0100848 | A1 * | 4/2015 | Kalamatianos | G11C 29/52 714/764 |
| 2015/0162099 | A1 * | 6/2015 | Jeong | G11C 29/42 714/719 |
| 2016/0056988 | A1 * | 2/2016 | Cheng | H04L 27/261 375/267 |
| 2016/0085613 | A1 * | 3/2016 | Huang | G06F 11/073 714/6.11 |
| 2018/0039540 | A1 * | 2/2018 | Lu | H03M 13/05 |
| 2018/0137005 | A1 * | 5/2018 | Wu | G11C 7/10 |
| 2018/0167088 | A1 * | 6/2018 | Vakilinia | G06F 11/108 |
| 2019/0260397 | A1 * | 8/2019 | Wu | G06F 11/1012 |

* cited by examiner

MEMORY TESTING TECHNIQUES

RELATED APPLICATIONS

This patent application claims priority to and the benefit of U.S. Provisional Patent Application No. 62/780,881, filed 2018 Dec. 17 and titled MEMORY TESTING TECHNIQUES, which is incorporated herein by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional memory built-in self testing (MBIST) may find errors. However, certain errors are not being detected or repaired with MBIST because conventional MBIST does not use error correcting code (ECC) to repair those certain errors. As such, there exists a need to improve memory testing so as to efficiently use MBIST and ECC logic to improve the yield of random access memory (RAM).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to various testing schemes and techniques for memory applications. For instance, various schemes and techniques described herein are directed to memory built-in self-testing (MBIST) for efficient redundancy and ECC usage to improve memory cell yield. Some MBIST testing locates some errors without ECC and repairs some errors using redundancy, wherein redundancy repair refers to column and/or row redundancy repair. If some errors remain after redundancy repair, MBIST typically determines such tested chip as a bad memory chip. Some of these errors may be fixed using ECC logic, and using ECC logic to repair these errors is desirable to improve yield on RAM, such as eMRAM. Therefore, various schemes and techniques described herein are directed to adapting MBIST for testing and repairing using redundancy and ECC. Thus, in various instances, multiple bits may be corrected (or repaired) using ECC correction for some errors, while reserving one or more bits for ECC correction in other in-field errors. To overcome deficiencies of conventional MBIST techniques, the memory testing schemes and techniques described herein provide for building a memory system to interface with a MBIST controller so as to bypass ECC logic, enable and use ECC logic, and also detect multi-bit errors. Also, various schemes and techniques described herein may combine the row/column repair capability with the ECC repair capability to repair hard fails, and also, the ECC repair capability may be used for soft fails that could appear during a life cycle of a product.

Various implementations of memory testing circuitry for memory applications will now be described in greater detail herein with reference to FIGS. 1-6D.

Figure 1:
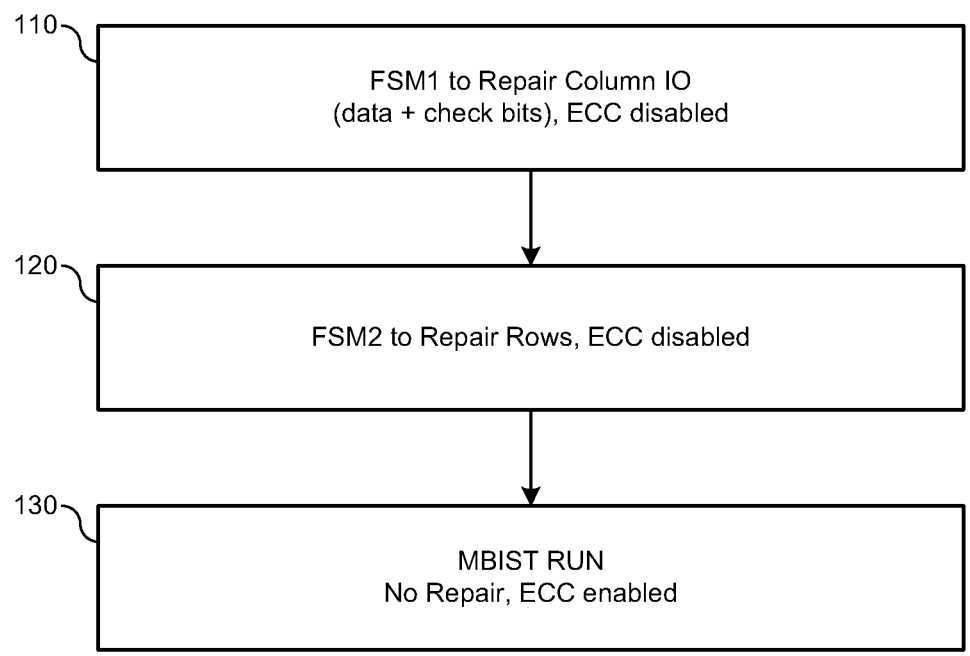
FIGS. 1-3 illustrate process diagrams of various methods for testing memory in accordance with various implementations described herein.
Figure 2:
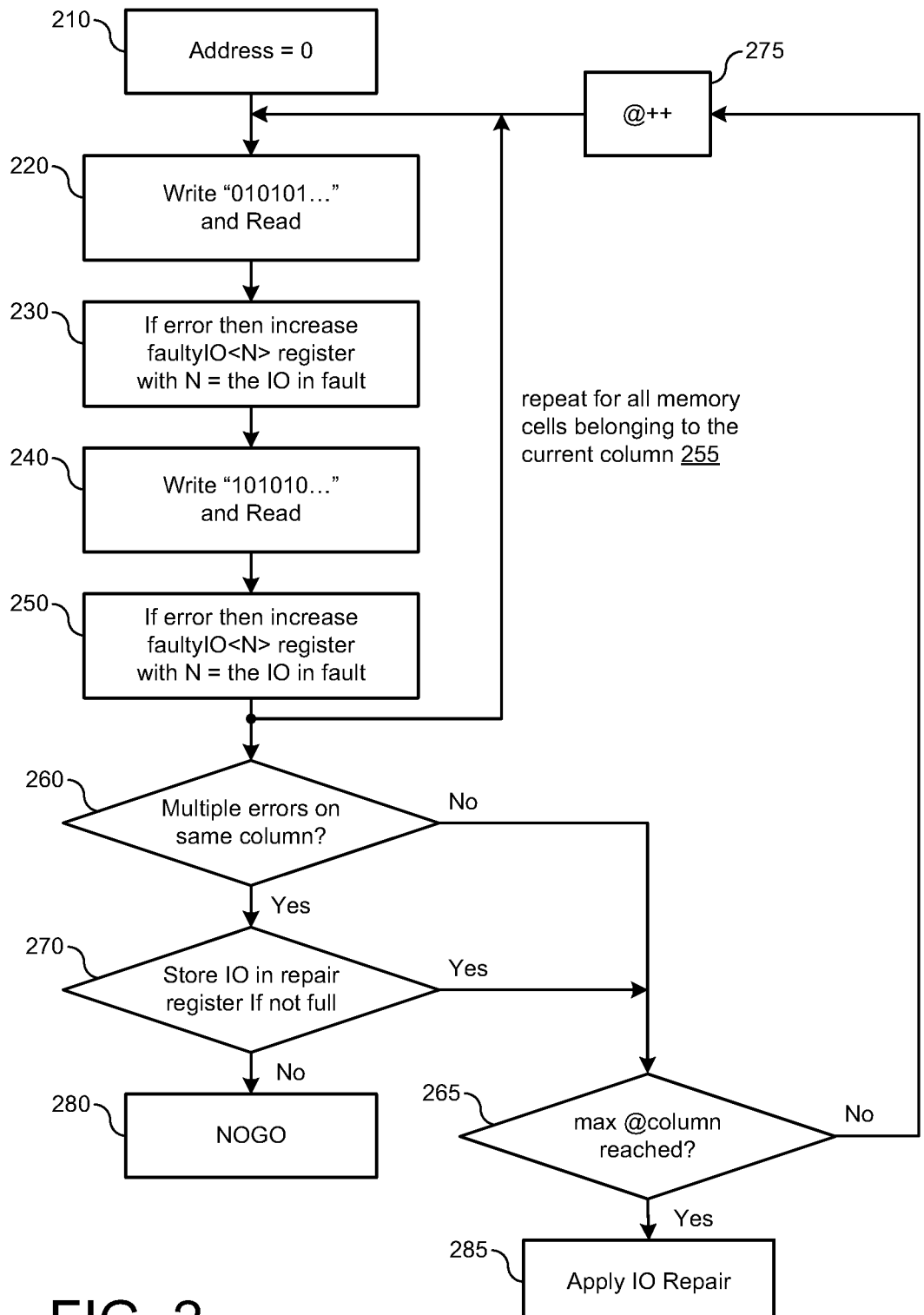
Figure 3:
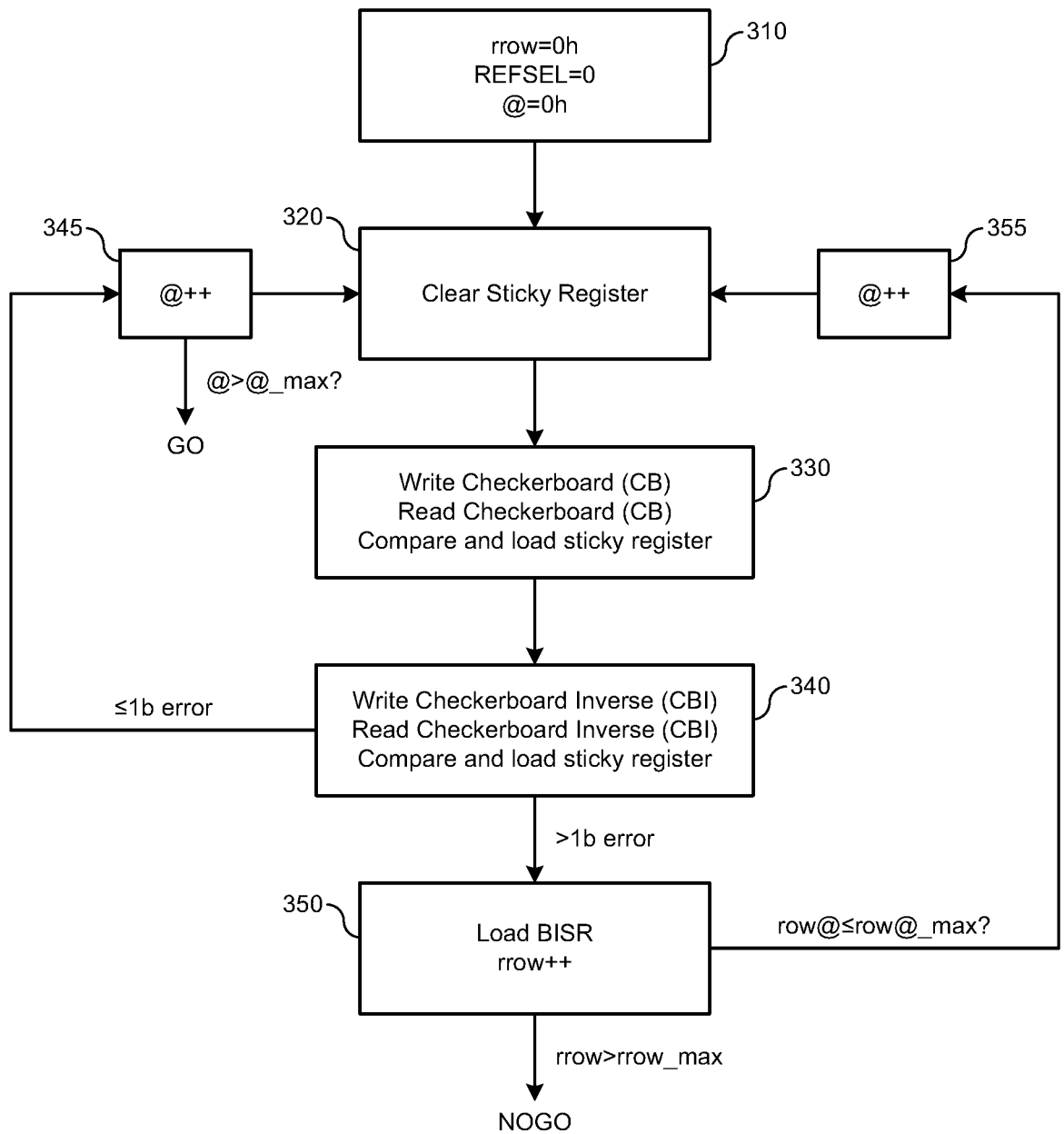

FIGS. 1-3 illustrate process diagrams of various methods for testing memory in accordance with implementations described herein. In particular, FIG. 1 illustrates a method 100 of repairing columns and rows along with an MBIST run, FIG. 2 illustrates a method 200 for repairing column related data using a finite state machine (FSM), and FIG. 3 illustrates a method 300 for repairing row related data using an FSM.

It should be understood that even though methods 100, 200, 300 may indicate a particular order of operation execution, in some cases, various certain portions of the operations may be executed in a different order, and on different systems. In other cases, additional operations and/or steps may be added to and/or omitted from the methods 100, 200, 300. The methods 100, 200, 300 may be implemented in hardware and/or software. If implemented in hardware, the methods 100, 200, 300 may be implemented with various circuit components, as described in reference to FIGS. 4-5B. If implemented in software, methods 100, 200, 300 may be implemented as a program or software instruction process configured for memory testing as described herein, and also, various instructions related to implementing the methods 100, 200, 300 may be stored in memory and/or a database. For instance, a computer or various other types of computing devices having a processor and memory may be configured to perform the methods 100, 200, 300.

As described and shown in reference to FIG. 1, method 100 may be used for repairing columns and rows along with an MBIST run in accordance with various schemes and techniques described herein. For instance, as described herein, method 100 may be used for improving memory testing for efficient ECC usage to thereby improve yield.

Method 100 may identify memory for error correction, wherein the memory has an array of bitcells arranged in columns and rows. In some implementations, the memory refers to memory circuitry that includes the array of bitcells arranged with any number (M) of columns and any number (N) of rows. Each bitcell in the array of bitcells may be referred to as a memory cell, and each bitcell may be configured to store at least one data bit value (e.g., a data value associated with logical '0' or '1'). Each row of bitcells in the array of bitcells include any number of bitcells (or memory cells) arranged in various configurations, such as, e.g., a two-dimensional (2D) memory array having columns and rows of multiple bitcells arranged in a 2D grid pattern with 2D indexing capabilities. Each bitcell may be implemented with random access memory (RAM) circuitry, or other type of volatile type memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In other instances, each bitcell may be implemented with an embedded magneto-resistive RAM (eMRAM) cell, or similar non-volatile bitcell.

At block 110, method 100 may use a first finite state machine (FSM) to repair column input-output (IO) data with error correcting code (ECC) disabled. The column IO data refers to data bits plus check bits. In some implementations, method 100 may perform column error repair for the memory to detect a number of column errors in the columns by analyzing column related data in the columns with error accumulation and by repairing the column related data in the columns with redundancy if the number of column errors in a column is greater than a first predetermined number of errors.

In some instances, the first predetermined number of errors may refer to multiple column errors, and if the multiple column errors are detected in the column related data, then method 100 may enable column redundancy repair and the multiple column errors may be repaired with column redundancy. In some implementations, the multiple column errors may refer to three or more column errors.

At block 120, method 100 may use a second FSM to repair row data with ECC disabled. In some implementations, method 100 emulates row error correction capability for the memory to detect a number of row errors in the rows by analyzing row related data in the rows with error accumulation and by repairing the row related data in the rows with redundancy if the number of row errors is greater than a second predetermined number of errors (e.g., if 2 or more errors in a same data set, e.g., SL0, or a same address, then repair complete row). Also, if the number of row errors is less than or equal to the second predetermined number of errors (e.g., 1-bit error is detected), then use (or rely on) error correcting code (ECC) to repair bit errors in the row related data for the rows.

In some instances, the second predetermined number of errors may refer to multiple row errors, and if multiple row errors are detected in a same data set, then the entire row may be repaired with row redundancy. Also, the multiple row errors may refer to two or more errors in the same data set, and the same data set may refer to a same row address. As shown in FIGS. 6A-6D, the same data set may refer to data related to a same source line (SL) data set, such as, e.g., SL0 data, that may be associated to the same data set for each column IO6 to IO0. Similarly, each of SL0, SL1, SL2, SL3 data may be associated to the same data set for each column IO6 to IO0. For instance, the data may include several bits (i.e., =several IO). When one address is read, it means that one WL is selected (e.g., WL1), and one SL is selected for each IO (e.g., SL2). In this instance, the address (@) may include a number of bits to select one WL among 4 WLs, and the bits may also be used to select 1 SL among 4 SLs. As such, when address=01 01, it means that WL1 is selected and SL1 is selected from all of the IO. In addition, it allows the capability to read 7 bits (e.g., IO0 to IO6).

At block 130, an MBIST run may be performed with ECC enabled and with no repair involved. For instance, at block 130, a BIST may be run on a memory that has been repaired in terms of Row and Column (e.g., at blocks 110 and 120). As the memory should be repaired, an intention of block 130 may be to ensure that the BIST passes. If the BIST detects an error, it means that the repair detected at block 110 and 120 is not correct, more errors have been detected by the BIST, and/or the ECC was not able to repair it. In some implementations, the MBIST run may refer to using an ECC encoder to receive input data (n bits) from MBIST circuitry, generate encoded data (m bits), and then write the encoded data (m bits) to memory. The encoded data (m bits) may be generated by encoding the input data (n bits) and by adding check bits to the input data (n bits). The MBIST run may also refer to using an ECC decoder to read the encoded data (m bits) from the memory, generate corrected data (n bits), and provide the corrected data (n bits) and a multi-bit error flag as output. The corrected data (n bits) may be generated by decoding the encoded data (m bits) and by extracting the check bits from the encoded data (m bits). The ECC decoder may have error correction logic that performs error correction on the decoded data (n bits) based on the check bits. If the error correction logic detects a multi-bit error in the decoded data (n bits), then the error correction logic corrects the multi-bit error in the decoded data (n bits) to provide the corrected data (n bits). In some instances, m>n, wherein the check bits are added to the n bits which equals the m bits (i.e., m=n+check_bits). These and other aspects related to the MBIST run are described herein below in reference to FIG. 4.

As described and shown in reference to FIG. 2, method 200 may be used for repairing column related data using the first FSM in accordance with various schemes and techniques described herein. For instance, as described herein, method 200 may be used for improving memory testing for efficient ECC usage to thereby improve yield.

At block 210, method 200 may select an address (e.g., address=0) to perform error correction. In some implementations, method 200 may identify memory having an array of bitcells, and also, method 200 may select a column (or column address) in the array of bitcells for error correction. In some implementations, the column (or column address) may refer to a column IO.

At block 220, method 200 may write a first column data sequence (such as, e.g., 010101 . . . ) to the column (or column address), and method 200 may read a second column data sequence from the column (or column address) after writing the first column data sequence to the column (or column address).

At block 230, method 200 may determine or detect a number of errors (e.g., a first number of errors), wherein if errors are detected, then a column error count register (e.g., faultyIO<N>, with N=the IO in fault) may be increased by a column error count. In some implementations, method 200 may check the second column data sequence for a number of errors by comparing the first column data sequence to the second column data sequence. Also, in this instance, method 200 may accumulate a column error count by increasing a column error counter by the number of errors (e.g., the first number of errors) that were detected in the column (or column address).

At block 240, method 200 may write a third column data sequence (such as, e.g., 101010 . . . ) to the column (or column address), and method 200 may read a fourth column data sequence from the column (or column address) after writing the third column data sequence to the column (or column address). In some implementations, the third data sequence may be a complement or an inverse of the first data sequence.

At block 250, method 200 may determine or detect a number of errors (e.g., a second number of errors), wherein if errors are detected, then the column error count register (e.g., faultyIO<N>, with N=the IO in fault) may be increased by a column error count. In some instances, method 200 may check the fourth column data sequence for a number of errors by comparing the third column data sequence to the fourth column data sequence. Also, in this instance, method 200 may accumulate the column error count by increasing the column error counter by the number of errors (e.g., the second number of errors) that were detected in the column (or column address).

As shown in FIG. 2, in reference to operation 255, blocks 220-250 may be repeated for one or more or all additional memory cells belonging to a current column. In this instance, this error accumulation loop may be performed by incrementing an error counter to achieve error counting in the current column. At decision block 260, method 200 may determine whether there are multiple column errors (e.g., 3 or more errors) on a same column (or column address). If not, then method 200 advances to decision block 265. If yes, then method 200 advances to decision block 270. If the column error count register (e.g., faultyIO<N>, with N=the IO in fault) refers to multiple errors (e.g., 3 or more errors), then method 200 advances to decision block 270. In some instances, any number of multiple errors may be detected.

At block 270, method 200 may store the column address (or column IO address) associated with the column in the repair register (e.g., faultyIO<N>, with N=the IO in fault) for repair using column redundancy if the number of errors in the column error count is greater than or equal to the predetermined number of errors (e.g., 3 or more errors). In some implementations, the repair register (e.g., faultyIO<N>, with N=the IO in fault) may be full. In this instance, if the column address is not stored in the repair register, then in block 280, method 200 may determine that the memory chip is a bad chip and should not be used (NOGO). Otherwise, if the column address is stored in the repair register, then method 200 advances to decision block 265.

In decision block 265, method 200 determines if a maximum number of columns (max @column) has been reached. If not, then method 200 advances to block 275 to process a next column address (@++) in the memory, and from block 275, method 200 then returns to block 220. Otherwise, in decision block 265, if the maximum number of columns (max @columns) has been reached, then method 200 advances to block 285 to apply IO repair to the column address.

As described and shown in reference to FIG. 3, method 300 may be used for repairing row related data using a second FSM in accordance with various schemes and techniques described herein. For instance, as described herein, method 300 may be used for improving memory testing for efficient ECC usage to thereby improve yield.

At block 310, method 300 may select an address (e.g., row address, rrow=0h, REFSEL=0, address=0h) to perform error correction. In some implementations, method 300 may identify memory having an array of bitcells, and also, method 300 may select a row (or row address) in the array of bitcells for error correction. In this instance, the ampersand symbol refers to any memory "address". The term rrow (redundant row) refers to a variable that reflects a number of redundant rows needed to repair the memory. For instance, the number of redundant rows may include a few spare elements (e.g., 8, with rrow_max=8). In some cases, when more redundant rows than rrow_max are needed, the memory may not be repaired, and thus, the memory is a NOGO.

At block 320, method 300 may clear a sticky register. For instance, the sticky register may be used as a register to accumulate (or count) errors detected in a row.

At block 330, method 300 may write a first column data sequence (such as a checkerboard data sequence, e.g., 010101 . . . ) to the row (or row address), and method 300 may read a second row data sequence from the row (or row address) after writing the first row data sequence to the row (or row address). Also, method 300 may compare and load the sticky register with a comparison of the first data sequence and the second data sequence to highlight the bit errors in the first data sequence for counting a number of errors in the row related data. In some cases, a Boolean operation (e.g., AND or OR) may be used to highlight differences (i.e., errors) between the first data sequence and the second data sequence. However, other methods may be used to highlight and count the differences (or errors). In some implementations, method 300 may check the second row data sequence for a number of errors by comparing the first row data sequence to the second row data sequence, and method 300 may accumulate a row error count by increasing a row error counter by the number of errors. Also, in some instances, the sticky register is performing error accumulation for a whole row (WL) and not between a first row and a second row. For instance, in reference to FIG. 6, when one row (one WL) is selected, the sticky register will accumulate the errors with SL0 selected, then SL1 selected, then SL2 selected, and then SL3 selected. As such, this means that write/read is performed at 4 addresses and errors in the sticky registers are accumulated for these 4 addresses. Once done, the sticky register may be cleared and the next row is processed.

At block 340, method 300 may write a third column data sequence (such as an inverse checkerboard data sequence, e.g., 101010 . . . ) to the row (or row address), and method 300 may read a fourth row data sequence from the row (or row address) after writing the third row data sequence to the row (or row address). Also, method 300 may compare and load the sticky register with the third and fourth data sequences to count a number of errors in the row related data. In some implementations, method 300 may check the fourth row data sequence for a number of errors by comparing the third row data sequence to the fourth row data sequence, and method 300 may accumulate a row error count by increasing a row error counter by the number of errors. In some instances, the third data sequence is a complement or an inverse of the first data sequence.

Also, at block 340, if the row error count (that is reflected in the sticky register) is less than or equal to a predetermined number of errors (e.g., ≤one-bit error), method 300 advances to block 345. At block 345, method 300 proceeds to a next address (address++) and returns to block 320 to process the next row. In some instances, at block 345, if the address is greater than a maximum number of addresses (e.g., @>@_max), method 300 may determine that the memory chip is acceptable (GO), and then method 300 may recommend the memory chip for manufacturing. Otherwise, at block 340, if the row error count is greater than the predetermined number of errors (e.g., >one-bit error), method 300 advances to block 350. In this instance, the number of errors may refer to one or more errors.

At block 350, method 300 may load a built-in self-repair (BISR) to store a row address associated with the row in a repair register for repair using row redundancy if the number of errors in the row error count is greater than the predetermined number of errors (1 or more errors). In some implementations, method 300 may rely on error correcting code (ECC) to repair the number of errors in the row if the number of errors in the row error count is less than or equal to the predetermined number of errors (e.g., 1 error).

Also, at block 350, if the number of repaired rows is less than or equal to the maximum number of redundant rows (e.g., rrow@rrow_max), then method 300 may proceed to a next address (address++) and returns to block 320 to process the next address. Otherwise, at block 350, if the number of repaired rows is greater than the maximum number of redundant rows (e.g., rrow>rrow_max), method 300 may determine that the memory chip is not acceptable (NOGO), and method 300 may then not recommend the memory chip for manufacturing.

In some implementations, method 300 may process each row in an array of bitcells as follows. For instance, method 300 may write and read a predetermined data sequence (e.g., 010101 . . . ) to a row, and when read, method 300 may count a number of errors and then store a fault in the sticky register. For instance, the sticky register may not store the error count, and a sticky register bit stays asserted until cleared. Whenever a data bit is detected as faulty, a corresponding (same index) bit from the sticky register is asserted and stays asserted until cleared. This corresponds to bit-wise error accumulation. Also, method 300 may write and read an inverse data sequence (e.g., 101010 . . . ) to the same row, and when read, method 300 may count the number of errors, and store the fault in the sticky register. Also, if more than a one-bit error is detected, then method 300 may repair the row with redundancy. Otherwise, if the error count is one-bit or less in the sticky register, then method 300 may rely on ECC to repair row error. Then, method 300 may move on (or advance) to the next row.

Figure 4:
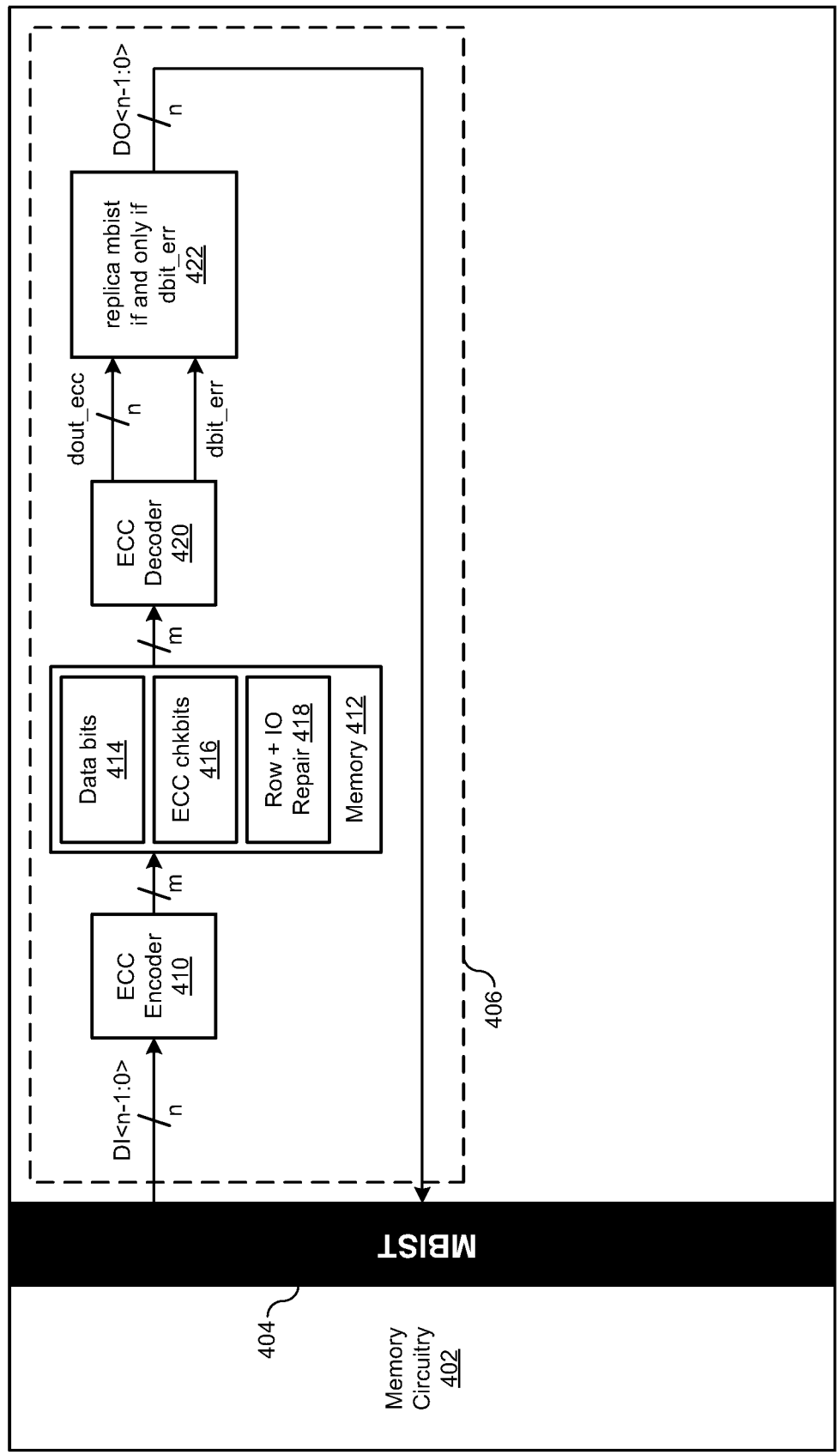
FIGS. 4-5B illustrate block diagrams of various memory testing circuitry in accordance with various implementations described herein.
Figure 5A:
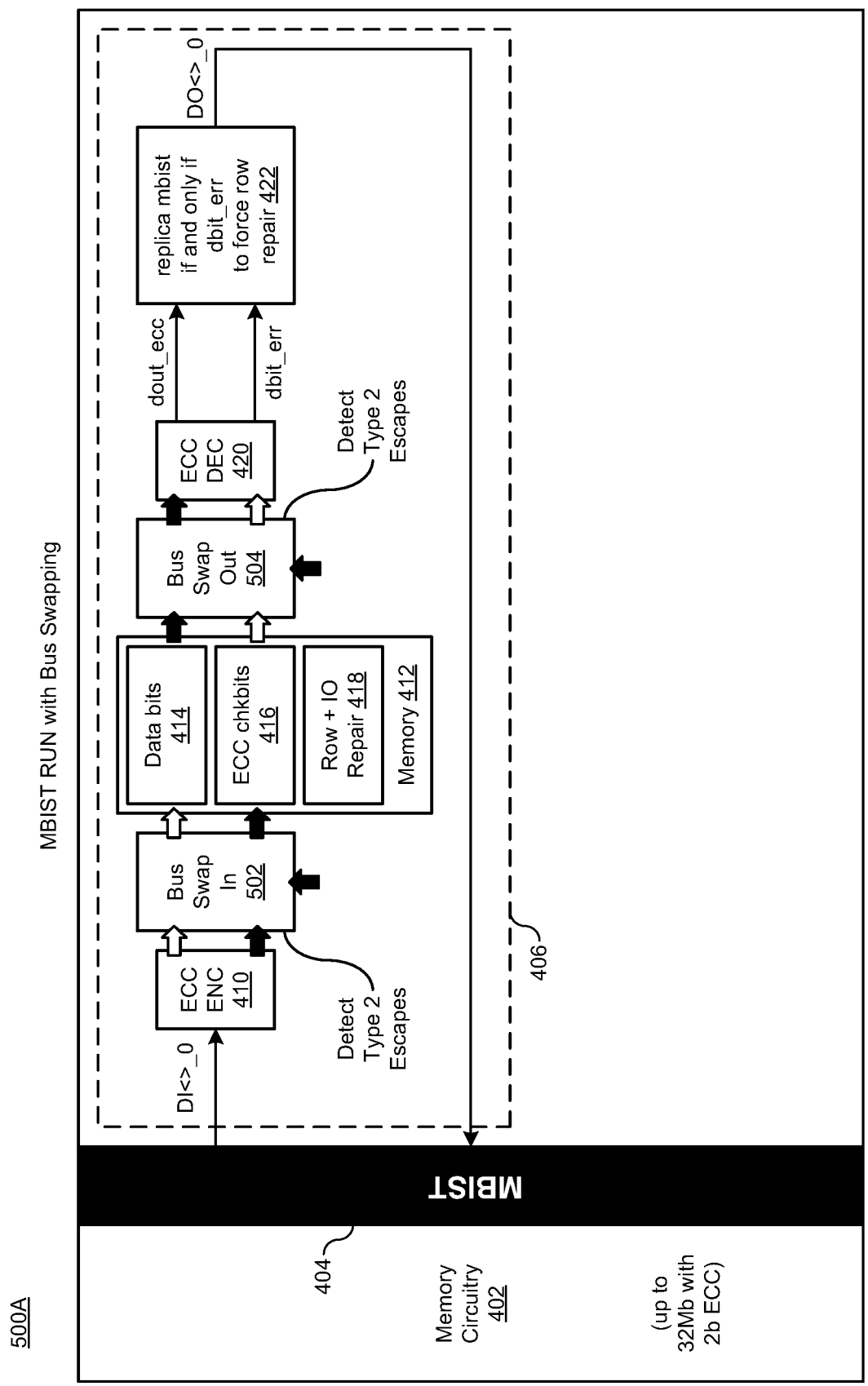
Figure 5B:
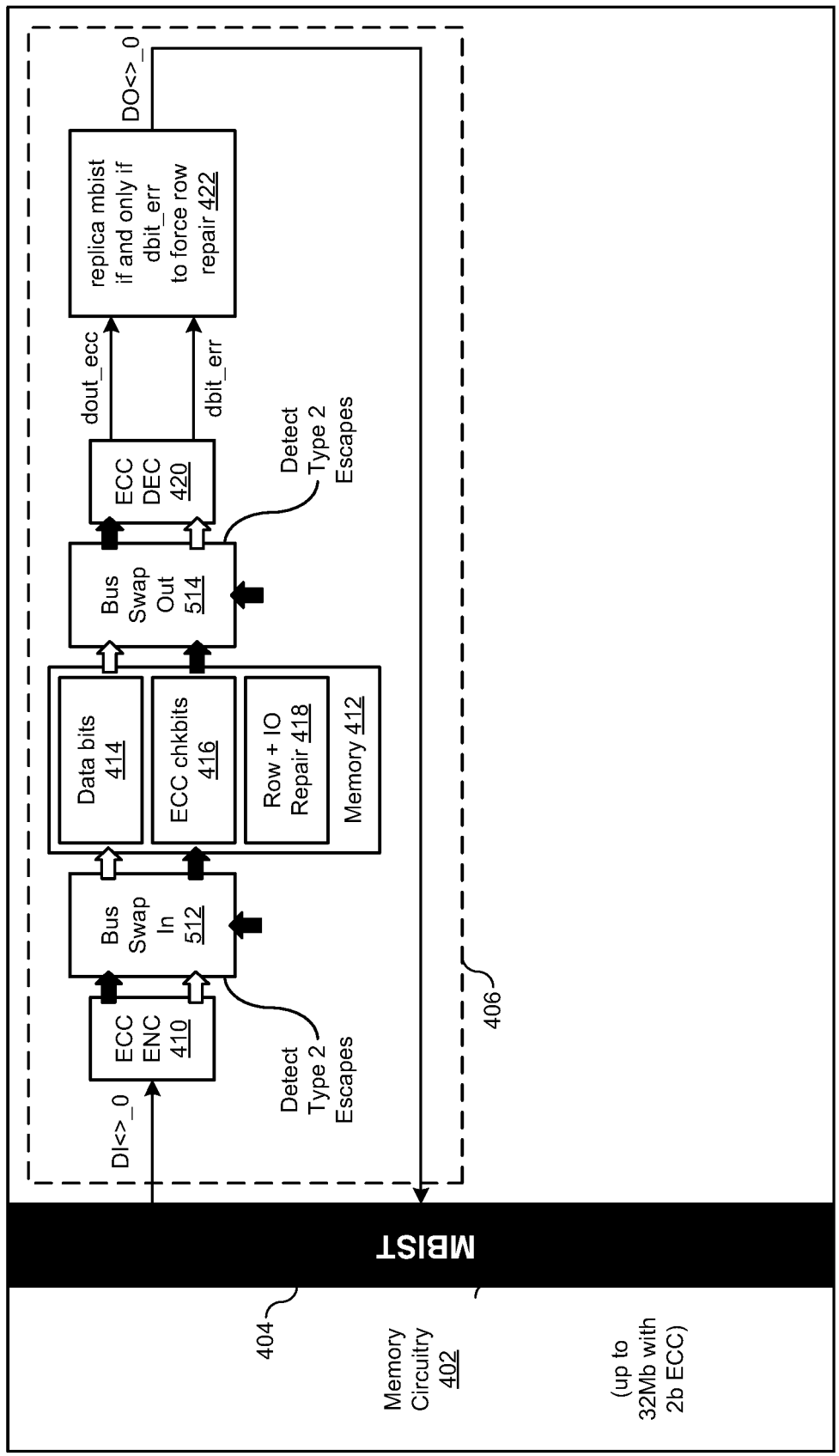

FIGS. 4-5B illustrate block diagrams of various memory testing circuitry in accordance with implementations described herein. In particular, FIG. 4 illustrates error correction circuitry 400 that is adapted for MBIST run with ECC enabled and with no repair involved, wherein the memory may be repaired due to FSM1 and FSM2, but MBIST may not perform repair on top of an existing repair solution, e.g., as described herein above in reference to FIGS. 1-3. In addition, FIG. 5A illustrates error correction circuitry 500A that is adapted for MBIST run without bus swapping, and FIG. 5B illustrates error correction circuitry 500B that is adapted for MBIST run with bus swapping.

As shown in FIG. 4, the error correction circuitry 400 may include memory circuitry 402, MBIST circuitry 404, and ECC circuitry 406. In some implementations, the ECC circuitry 406 may include various circuits including an ECC encoder 410, a memory 412, an ECC decoder 420, and a replica (or fake) MBIST 422. The memory 412 may include data bits (n) 414, ECC check bits 416, and row and column IO repair logic and spare elements 418 (e.g., redundant rows and/or columns). Also, the error correction circuitry 400 may be implemented as an integrated circuit (IC) with various types of memory circuitry 402 and memory 412, such as, e.g., any type of memory.

The ECC encoder 410 is coupled to the memory 412. The ECC encoder 410 receives input data (n bits based on DI<n–1:0>) from the MBIST circuitry 404, generates encoded data (m bits) by encoding the input data (n bits) and by adding check bits to the input data (n bits), and writes the encoded data (m bits) to the memory 412. In some instances, m>n, wherein the check bits are added to n bits=m bits (m=n+check_bits). Also, the memory 412 stores the input data (n bits), the ECC check bits 416, and row and/or column related redundancy repair. The ECC decoder 420 is also coupled to the memory 412, and the ECC decoder 420 reads the encoded data (m bits) from the memory 412, generates corrected data (dout_ecc with n bits) by decoding the encoded data (m bits) and by extracting the check bits from the encoded data (m bits), and provides the corrected data (dout_ecc with n bits) and multi-bit error flag (dbit_err) as output. The multi-bit error flag (dbit_err) may refer to a double-bit error). In some implementations, the ECC decoder 420 may include error correction logic that performs error correction on the decoded data (n bits) based on the check bits. The multi-bit error flag (dbit_err) refers to additional information from the ECC logic.

In some implementations, if the multi-bit error flag (dbit_err) in the decoded data (n bits) is less than a one-bit error, then the error correction logic provides an error flag of zero. If the multi-bit error flag (dbit_err) in the decoded data (n bits) is equal to a one-bit error, then the error correction logic corrects the one-bit error in the decoded data (n bits) and provides an error flag of zero. Also, if the multi-bit error flag (dbit_err) in the decoded data (n bits) is greater than a one-bit error, then the error correction logic may attempt to correct the multi-bit error in the decoded data (n bits) and may provide an error flag of one. In each case, the memory 412 may use row and column repair 418.

In some implementations, MBIST may be run for n bits with ECC logic, and 2 or less bit errors may be corrected with ECC and still leave 1 bit error correction capability in field. If there are 3 or more bit errors, then MBIST may be run for m bits without ECC logic, and if any error is found, redundancy repair may be used. After redundancy repair, some multi-bit errors may not be fully repaired using redundancy. Thus, in this instance, MBIST may be run on n bits with ECC logic, and 2 or less bit errors may be corrected with ECC and still leave 1 bit error correction capability in field. If there are 3 or more bit errors, then this error result may be considered as determining a bad memory chip.

As shown in FIG. 4, the error correction circuitry 400 may include the replica MBIST 422 that receives the corrected data (dout_ECC) and the error flag (dbit_err) from the ECC decoder 420 and provides output data (e.g., DO<n–1:0> with n bits) to the MBIST 404. In some instances, if the error flag is zero, then the replica MBIST 422 may rely on error correcting codeg (ECC) to correct (or repair) the multi-bit error in the data (n bits). However, in other instances, if the error flag (dbit_err) is one, then the replica MBIST 422 may reverse the data sequence of the corrected data (n bits). As such, with the replica MBIST, when the error flag (dbit_err) is 0, then the replica MBIST 422 does nothing, and the replica MBIST 422 relies on ECC to correct errors. However, when the error flag (dbit_err) is 1, then the replica MBIST 422 may modify DO (e.g., by reversing the data sequence of DO) to be sure that the MBIST 404 detects a fault in the data. In this instance, the memory chip is NOGO, wherein the memory chip is not recommended for use, and wherein the memory chip should be (or must be) swapped.

Generally, the MBIST 404 writes data, reads data, and compares read and write data to detect errors in the data. During a run of the MBIST 404, ECC is enabled, and no repair is involved. Also, the MBIST 404 does not know about internal error correction with redundancy. One goal of the schemes and techniques described herein may refer to not using internal repair capabilities of MBIST. Another goal of the schemes and techniques described herein may also refer to augmenting repair capabilities with FSMs.

As shown in FIG. 5A, the error correction circuitry 500A may be adapted for MBIST run without input and output bus swapping 502, 504. As shown in FIG. 5B, the error correction circuitry 500B may be adapted for MBIST run with input and output bus swapping 512, 514. Some components in FIGS. 5A-5B may be similar in scope, function and operation to similar components in FIG. 4.

In some implementations, checking for data errors may be performed in multiple passes through the ECC circuitry 406, e.g., in a first pass without bus swapping 502, 504 in FIG. 5A and in a second pass with bus swapping 512, 514 in FIG. 5B. The multiple passes through the ECC circuitry 406 may be used to increase coverage of error detection to ensure MBIST stress of bitcells in memory circuitry.

In FIG. 5A, with reference to error checking the encoded data from the ECC encoder 410, the first pass of input data 502 and output data 504 may be performed without data swap. For instance, during the first pass, the input data 502 without data swap may refer to a data sequence (e.g., 00000000), and the ECC encoder 410 may generate and add ECC check bits to the data sequence (e.g., 000000001011). The data sequence with check bits may be tested with MBIST run, and error detection is performed by the MBIST 404 by comparing the input data (DI) 502 to the output data (DO) 504. Similarly, in another instance, during another first pass, the input data 502 may refer to an inverted data sequence (e.g., 11111111), and the ECC encoder 410 may generate an inverted data sequence with ECC check bits (e.g., 111111110110). In this instance, the inverted data sequence with check bits may be tested with MBIST run, and the output data 504 may be compared to the input data 502 for error detection.

In FIG. 5B, with reference to error checking the encoded data from the ECC encoder 410, the second pass of input data 512 and output data 514 may be performed with data swap. For instance, during the second pass, the input data 512 with data swap may refer to the data sequence (e.g., 00000000), and the ECC encoder 410 may generate and swap the data sequence with ECC check bits (e.g., 101100000000). Also, the data sequence with check bits may be tested with MBIST run, and error detection is performed by the MBIST 404 by comparing the input data (DI) 512 to the output data 514. Similarly, in another instance, during another first pass, the input data 512 may refer to the inverted data sequence (e.g., 11111111), and the ECC encoder 410 may generate and swap the inverted data sequence with ECC check bits (e.g., 011011111111). In this instance, the inverted data sequence with check bits may be tested with MBIST run, and error detection is performed by the MBIST 404 by comparing the input data (DI) 512 to the output data 514.

Figure 6A:
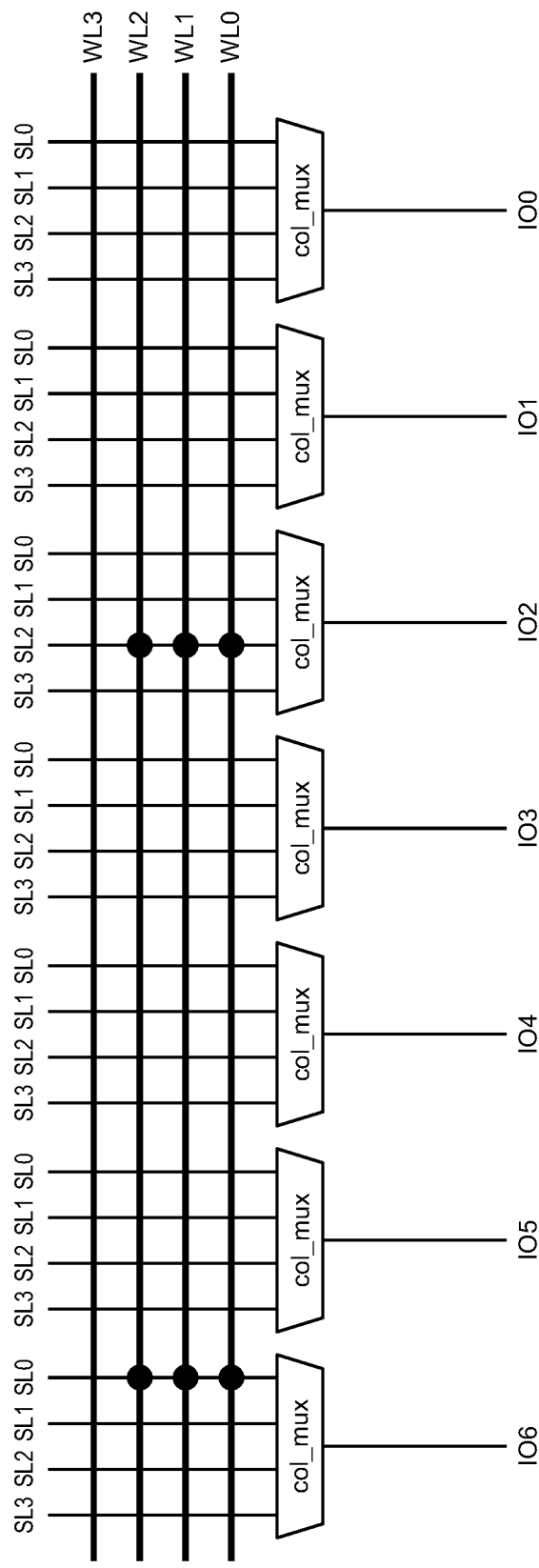
FIGS. 6A-6D illustrate diagrams of various memory circuitry in accordance with various implementations described herein.
Figure 6B:
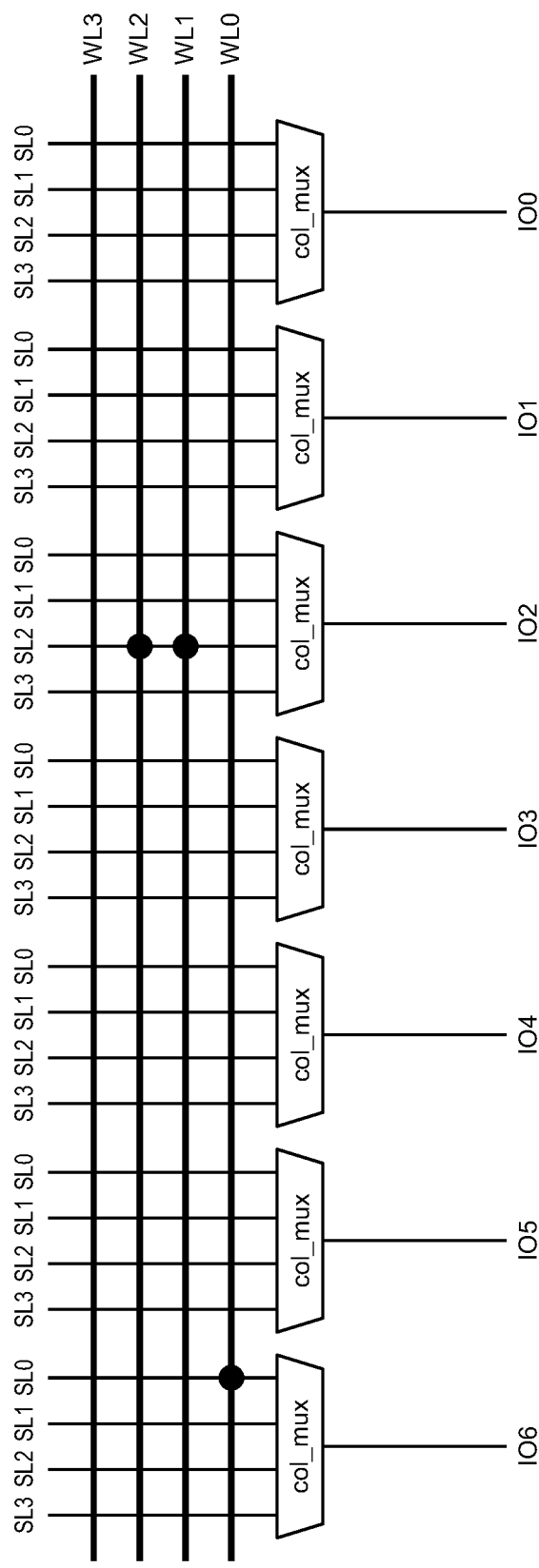
Figure 6C:
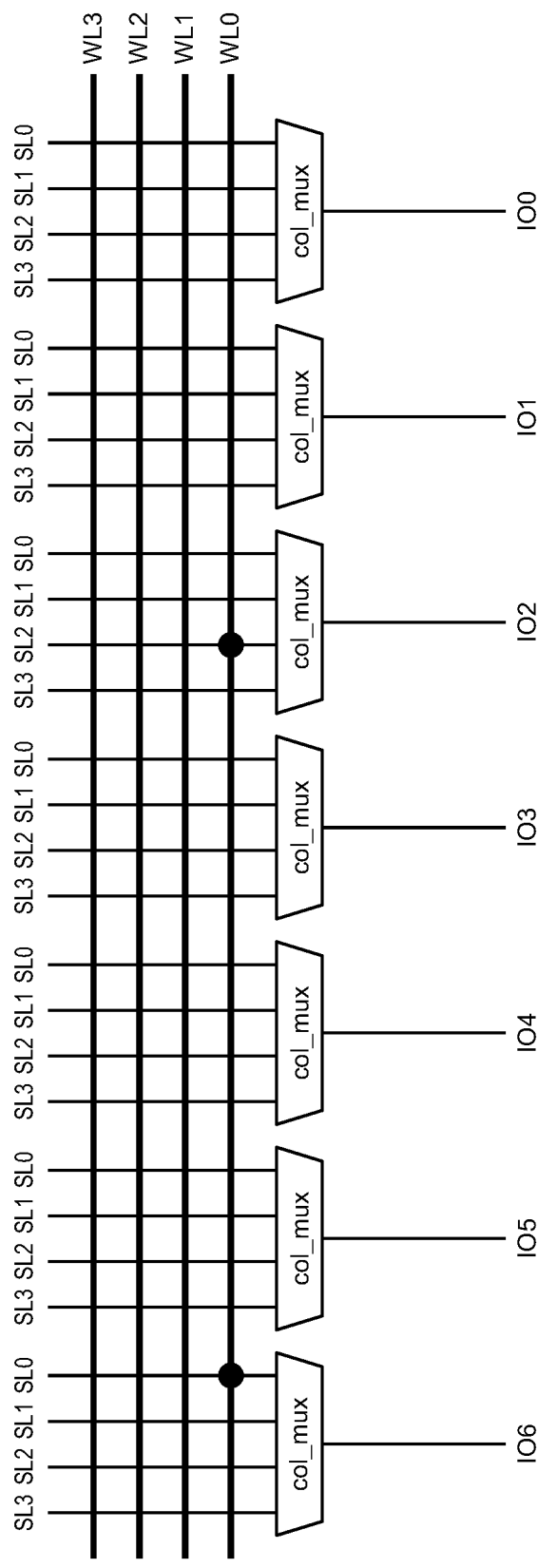
Figure 6D:
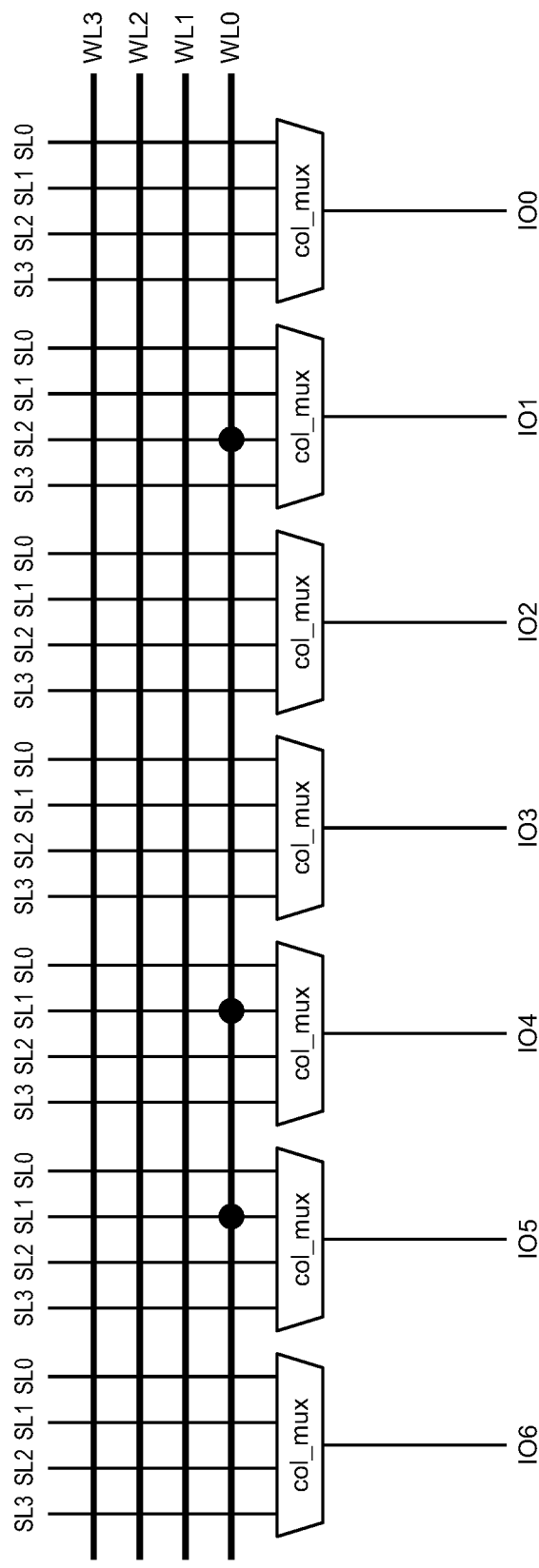

FIGS. 6A-6D illustrate diagrams of memory circuitry 600 in accordance with various implementations described herein. In particular, FIG. 6A illustrates a diagram 600A of the memory circuitry 600 with multiple column errors, FIG. 6B illustrates another diagram 600B of the memory circuitry 600 with single and multiple column errors, FIG. 6C illustrates a diagram 600C of the memory circuitry 600 with single row errors, and FIG. 6D illustrates another diagram 600D of the memory circuitry 600 with row errors, e.g., wherein a data set based on SL1 has 2-bit row errors. In FIGS. 6A-6D, the memory circuitry 600 is arranged in rows (WL0, WL1, WL2, WL3 and sets of columns (SL0, SL1, SL2, SL3). Also, the memory circuitry 600 includes column multiplexers (col_mux) that are coupled to the sets of columns (SL0, SL1, SL2, SL3) and provide column IO (IO0, IO1, IO2, IO3, IO4, IO5, IO6).

As shown in FIG. 6A, three errors (black dots) are detected on column (SL0) for column IO6, and three errors are also detected on column (SL2) for column IO2. In this instance, the internal repair circuitry may arbitrarily repair column IO2, and the ECC circuitry may attempt to repair column IO6. If the ECC circuitry is not able to repair column IO6, then the ECC circuitry may recommend that the memory chip has failed and should not be used for fabrication or manufacturing (i.e., a NOGO for chip use).

As shown in FIG. 6B, one error (black dot) is detected on column (SL0) for column IO6, and two errors are also detected on column (SL2) for column IO2. In this instance, the internal repair circuitry may arbitrarily repair the errors on column IO2, and the ECC circuitry may also repair the single error on column IO6. Generally, the ECC circuitry may be able to use ECC to repair less than three errors for each column IO.

As shown in FIG. 6C, two errors (black dots) are detected on row (WL0), e.g., one row error related to column (SL0) for IO6, and one row error related to column (SL2) for IO2. In this instance, the row errors are not in the same set of columns, e.g., the set of columns (SL0) is not the same as the set of columns (SL2). As such, the ECC circuitry may arbitrarily repair the row errors on column IO2 and column IO6. Generally, the ECC circuitry may be able to use ECC to repair less than two errors for a given word.

As shown in FIG. 6D, three errors (black dots) may be detected on row (WL0), e.g., two row errors related to column (SL1) for IO5, IO4, and one row error related to column (SL2) for IO1. In this instance, the two row errors are in the same set of columns (SL1), and the ECC circuitry may not be able to repair two or more errors in the same set of columns (SL1). As such, even though the ECC circuitry may arbitrarily repair the single row error on column (SL2) for 101, the ECC circuitry may not be able to use ECC to repair two or more errors in the same set of columns (SL1) for IO5, IO4. As such, in this case, the FSM row repair will repair the WL0 because there are 2 SL1 in error on the WL0.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the memory array 104 may be accessed with a wordline WL and complementary bitlines BL, NBL.

Generally, static RAM bitcells may include 6T bitcells, which may have access ports controlled by wordlines (WLs). In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

In some implementations, other RAM bitcells may include eMRAM cells. Unlike conventional RAM cells, such as, e.g., SRAM, data in eMRAM is stored using magnetic storage elements, instead of using an electric charge or current. The magnetic elements may be formed with two ferromagnetic plates separated by a thin insulating layer, wherein one plates has a set polarity with a permanent magnet and the other plate is selectively magnetized to show a resistive differential across the plates. This configuration is known as a magnetic tunnel junction and forms the structure for an MRAM cell. To store data, the two plates will have the same magnetization alignment (low resistance state), and this data storage state is translated as a logical 1 state. Otherwise, when the magnetization alignment is not the same (high resistance state), this other data storage state is translated as a logical 0 state.

Described herein are various implementations of method. The method may include identifying memory for error correction, wherein the memory has an array of bitcells arranged in columns and rows. The method may include perform column error repair for the memory to detect a number of column errors in the columns by analyzing column related data in the columns with error accumulation and repairing the column related data in the columns with redundancy if the number of column errors is greater than a first predetermined number of errors. The method may include emulating row error correction capability for the memory to detect a number of row errors in the rows by analyzing row related data in the rows with error accumulation and repairing the row related data in the rows with redundancy if the number of row errors is greater than a second predetermined number of errors. If the number of row errors is less than or equal to the second predetermined number of errors, then relying on error correction coding (ECC) to repair bit errors in the row related data for the rows.

Described herein are various implementations of method. The method may include identifying memory having an array of bitcells. The method may include selecting a column in the array of bitcells for error correction. The method may include writing a first column data sequence to the column. The method may include reading a second column data sequence from the column after writing the first column data sequence to the column. The method may include checking the second column data sequence for a number of errors by comparing the first column data sequence to the second column data sequence. The method may include accumulating a column error count by increasing a column error counter by the number of errors. The method may include storing a column address associated with the column in a repair register for repair using column redundancy if the number of errors in the column error count is greater than or equal to a predetermined number of errors.

Described herein are various implementations of method. The method may include identifying memory having an array of bitcells. The method may include selecting a row in the array of bitcells for error correction. The method may include writing a first row data sequence to the row. The method may include reading a second row data sequence from the row after writing the first row data sequence to the row. The method may include checking the second row data sequence for a number of errors by comparing the first row data sequence to the second row data sequence. The method may include accumulating a row error count by increasing a row error counter by the number of errors. The method may include storing a row address associated with the row in a repair register for repair using row redundancy if the number of errors in the row error count is greater than a predetermined number of errors. The method may include relying on error correction coding (ECC) to repair the number of errors in the row if the number of errors in the row error count is less than or equal to the predetermined number of errors.

Described herein are various implementations of a device. The device may include an error correction coding (ECC) encoder coupled to memory. The ECC encoder receives input data (n bits) from memory built-in self-test (MBIST) circuitry, generates encoded data (m bits) by encoding the input data (n bits) and by adding check bits to the input data (n bits), and writes the encoded data (m bits) to the memory. The device may include an ECC decoder coupled to the memory. The ECC decoder reads the encoded data (m bits) from the memory, generates corrected data (n bits) by decoding the encoded data (n bits) and by extracting the check bits from the encoded data (m bits), and provides the corrected data (n bits) and double-bit error flag as output. The ECC decoder has error correction logic that performs error correction on the decoded data (n bits) based on the check bits, wherein if the error correction logic detects a multi-bit error in the decoded data (n bits), the error correction logic corrects the multi-bit error in the decoded data (n bits) to provide the corrected data (n bits).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
    identifying memory for error correction, wherein the memory has an array of bitcells arranged in columns and rows;
    analyzing column related data in the columns with error accumulation to detect a number of column errors including multiple column errors in the columns;
    repairing the column related data in the columns with column redundancy including repairing the multiple column errors in each column with column redundancy;
    analyzing row related data in the rows with error accumulation to detect a number of row errors including multiple row errors in the rows; and
    repairing the row related data in the rows with row redundancy including repairing the multiple row errors in each row with row redundancy,
    wherein repairing the column related data includes writing multiple data sequences to each column, reading the multiple data sequences from each column, comparing the written data sequences to the read data sequences, and repairing the column errors in each column with column redundancy, and
    wherein repairing the row related data includes writing multiple data sequences to each row, reading the multiple data sequences from each row, comparing the written data sequences to the read data sequences, and repairing the row errors in each row with row redundancy.

2. The method of claim 1, further comprising:
    performing column error repair for the memory by repairing the column related data in the columns with the column redundancy when the number of column errors is greater than a first predetermined number of errors;
    wherein the first predetermined number of errors refers to the multiple column errors, and wherein if the multiple column errors are detected in the column related data, then the method enables column redundancy repair and the multiple column errors are repaired with the column redundancy.

3. The method of claim 2, wherein the multiple column errors refer to three or more column errors.

4. The method of claim 2, further comprising:
    emulating row error correction capability for the memory by repairing the row related data in the rows with the row redundancy when the number of row errors is greater than a second predetermined number of errors; and
    if the number of row errors is less than or equal to the second predetermined number of errors, then relying on error correction coding (ECC) to repair bit errors in the row related data for the rows,
    wherein the second predetermined number of errors refers to the multiple row errors, and wherein if multiple row errors are detected in a same data set, then the entire row is repaired with the row redundancy.

5. The method of claim 4, wherein the multiple row errors refer to two or more errors in the same data set.

6. The method of claim 4, wherein the same data set refers to a same address.

7. A method, comprising:
    identifying memory having an array of bitcells;
    selecting a column in the array of bitcells for error correction;
    writing a first column data sequence to the column;
    reading a second column data sequence from the column after writing the first column data sequence to the column;
    checking the second column data sequence for a number of errors by comparing the first column data sequence to the second column data sequence;
    accumulating a column error count by increasing a column error counter by the number of errors;
    writing a third column data sequence to the column;
    reading a fourth column data sequence from the column after writing the third column data sequence to the column;
    checking the fourth column data sequence for the number of errors by comparing the third column data sequence to the fourth column data sequence;
    accumulating the column error count by increasing the column error counter by the number of errors; and
    storing a column address associated with the column in a repair register for repair using column redundancy if the number of errors in the column error count is greater than or equal to a predetermined number of errors.

8. The method of claim 7, wherein the number of errors refers to multiple errors.

9. The method of claim 8, wherein the multiple errors refer to three or more errors.

10. The method of claim 7, wherein the third data sequence is a complement or an inverse of the first data sequence.

11. A method, comprising:
    identifying memory having an array of bitcells;
    selecting a row in the array of bitcells for error correction;
    writing a first row data sequence to the row;
    reading a second row data sequence from the row after writing the first row data sequence to the row;
    checking the second row data sequence for a number of errors by comparing the first row data sequence to the second row data sequence;

accumulating a row error count by increasing a row error counter by the number of errors;

writing a third row data sequence to the row;

reading a fourth row data sequence from the row after writing the third row data sequence to the row;

checking the fourth row data sequence for the number of errors by comparing the third row data sequence to the fourth row data sequence;

accumulating the row error count by increasing the row error counter by the number of errors;

storing a row address associated with the row in a repair register for repair using row redundancy if the number of errors in the row error count is greater than a predetermined number of errors; and relying on error correction coding (ECC) to repair the number of errors in the row if the number of errors in the row error count is less than or equal to the predetermined number of errors.

12. The method of claim 11, wherein the number of errors refers to one or more errors.

13. The method of claim 11, wherein the third data sequence is a complement or an inverse of the first data sequence.

14. A method, comprising:

selecting a column in an array of bitcells for error correction;

writing a first array of data bits to the column and then reading a second array of data bits from the column;

performing a first column error check on the column by comparing the first array of data bits to the second array of data bits and increasing a column error count based on identifying errors between the first array of data bits and the second array of data bits;

writing a third array of data bits to the column and then reading a fourth array of data bits from the column; and performing a second column error check on the column that is different than the first column error check on the column by comparing the third array of data bits to the fourth array of data bits and increasing the column error count based on identifying errors between the third array of data bits and the fourth array of data bits, wherein the third array of data bits is a complement or an inverse of the first array of data bits.

15. The method of claim 14, further comprising:

storing a column address associated with the column in a repair register for repair using column redundancy if the number of errors in the column error count is greater than or equal to a predetermined number of errors.

16. A method, comprising:

selecting a column in an array of bitcells for error correction;

writing first data to the column and then reading second data from the column;

comparing the first data to the second data and increasing a column error count based on identifying errors between the first data and the second data;

writing third data to the column and then reading fourth data from the column; and comparing the third data to the fourth data and increasing the column error count based on identifying errors between the third data and the fourth data, wherein:

the first data refers to a first data sequence, the second data refers to a second data sequence, the third data refers to a third data sequence, the fourth data refers to a fourth data sequence, and the third data sequence is a complement or an inverse of the first data sequence.

17. A method, comprising:

selecting a row in an array of bitcells for error correction;

writing a first array of data bits to the row and then reading a second array of data bits from the row;

performing a first row error check on the row by comparing the first array of data bits to the second array of data bits and increasing a row error count based on identifying errors between the first array of data bits and the second array of data bits;

writing a third array of data bits to the row and then reading a fourth array of data bits from the row; and performing a second row error check on the row that is different than the first row error check on the row by comparing the third array of data bits to the fourth array of data bits and increasing the row error count based on identifying errors between the third array of data bits and the fourth array of data bits, wherein the third array of data bits is a complement or an inverse of the first array of data bits.

18. The method of claim 17, further comprising:

storing a row address associated with the row in a repair register for repair using row redundancy if the number of errors in the row error count is greater than or equal to a predetermined number of errors.

19. A method, comprising:

selecting a row in an array of bitcells for error correction;

writing first data to the row and then reading second data from the row;

comparing the first data to the second data and increasing a row error count based on identifying errors between the first data and the second data;

writing third data to the row and then reading fourth data from the row; and comparing the third data to the fourth data and increasing the row error count based on identifying errors between the third data and the fourth data, wherein:

the first data refers to a first data sequence, the second data refers to a second data sequence, the third data refers to a third data sequence, the fourth data refers to a fourth data sequence, and the third data sequence is a complement or an inverse of the first data sequence.

* * * * *